United States Patent
Tezuka et al.

(10) Patent No.: US 12,537,505 B2
(45) Date of Patent: Jan. 27, 2026

(54) ACOUSTIC WAVE DEVICE (71) Applicant: Murata Manufacturing Co., Ltd., Nagaokakyo (JP)

(72) Inventors: Tomoaki Tezuka, Nagaokakyo (JP); Toru Takeshita, Nagaokakyo (JP); Shinichi Fukuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 563 days.

(21) Appl. No.: 17/588,439

(22) Filed: Jan. 31, 2022

(65) Prior Publication Data

US 2022/0158614 A1 May 19, 2022

Related U.S. Application Data (63) Continuation of application No. PCT/JP2020/029698, filed on Aug. 3, 2020.

(30) Foreign Application Priority Data

Aug. 5, 2019 (JP) .................................. 2019-143783

(51) Int. Cl.
*H03H 9/145* (2006.01)
*H03H 9/25* (2006.01)
*H03H 9/64* (2006.01)

(52) U.S. Cl.
CPC .............. *H03H 9/145* (2013.01); *H03H 9/25* (2013.01); *H03H 9/6406* (2013.01)

(58) Field of Classification Search
CPC ............. H03H 9/145; H03H 9/25; H03H 9/64
See application file for complete search history.

(56) References Cited

U.S. PATENT DOCUMENTS 7,446,629 B2 * 11/2008 Nakamura ......... H03H 9/14588
                                                    333/133
9,148,118 B2 *  9/2015 Matsuda .............. H03H 9/6433
(Continued)

FOREIGN PATENT DOCUMENTS

JP      2014-093590 A    5/2014
JP      2017-118368 A    6/2017
(Continued)

OTHER PUBLICATIONS

Official Communication issued in International Patent Application No. PCT/JP2020/029698, mailed on Sep. 1, 2020.

*Primary Examiner* — Andrea Lindgren Baltzell
*Assistant Examiner* — Alan Wong
(74) *Attorney, Agent, or Firm* — Keating & Bennett, LLP (57) ABSTRACT

An acoustic wave device includes a piezoelectric substrate including a first side defining a portion of an outer circumference, and a second side shorter than the first side, IDT electrodes on the piezoelectric substrate, a support including a cavity and on the piezoelectric substrate to surround the IDT electrodes with the cavity, first and second partitioning supports on the piezoelectric substrate and disposed in an inner side of the cavity of the support, and a cover on the support and covering the cavity of the support. An extending direction of the first partitioning support is parallel or substantially parallel to an extending direction of the first side of the piezoelectric substrate. An extending direction of the second partitioning support is orthogonal or substantially orthogonal to the extending direction of the first partitioning support.

16 Claims, 4 Drawing Sheets

(56) References Cited

U.S. PATENT DOCUMENTS

| | | | |
|---|---|---|---|
| 10,135,419 B2 * | 11/2018 | Hirano | H03H 9/1092 |
| 10,812,042 B2 * | 10/2020 | Takeshita | H03H 9/1071 |
| 10,958,240 B2 * | 3/2021 | Fukushima | H03H 9/02984 |
| 11,489,509 B2 * | 11/2022 | Kawasaki | H03H 9/1092 |
| 11,751,480 B2 * | 9/2023 | Iwabuchi | H03H 9/02897 |
| | | | 310/313 R |
| 2012/0319802 A1 * | 12/2012 | Ochiai | H03H 9/02905 |
| | | | 333/193 |
| 2014/0003017 A1 | 1/2014 | Kai et al. | |
| 2014/0118094 A1 * | 5/2014 | Matsuda | H03H 9/6476 |
| | | | 333/195 |
| 2017/0187353 A1 * | 6/2017 | Hirano | H03H 9/0576 |

FOREIGN PATENT DOCUMENTS

| | | | | |
|---|---|---|---|---|
| WO | 2012/132147 A1 | 10/2012 | | |
| WO | WO-2019044178 A1 * | 3/2019 | | H03H 9/02015 |

* cited by examiner

ACOUSTIC WAVE DEVICE

CROSS REFERENCE TO RELATED APPLICATIONS

This application claims the benefit of priority to Japanese Patent Application No. 2019-143783 filed on Aug. 5, 2019 and is a Continuation Application of PCT Application No. PCT/JP2020/029698 filed on Aug. 3, 2020. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices have been widely used for filters of cellular phones, for example. International Publication No. 2012/132147 discloses an example of a surface acoustic wave device with wafer level package (WLP) structure. In this surface acoustic wave device, a plurality of interdigital transducer (IDT) electrodes are provided on a substrate. The plurality of IDT electrodes are arranged in a hollow portion surrounded by the substrate, a frame-like support body, and a lid body.

The support body has a projection portion that extends to the inner side of a support main body. The projection portion is provided between long sides of the support main body so as to partition the support main body. On one region obtained through the partition by the projection portion, a transmission filter including a portion of the plurality of IDT electrodes is configured. On the other region obtained through the partition by the projection portion, a reception filter including another portion of the plurality of IDT electrodes is configured.

In the surface acoustic wave device described in International Publication No. 2012/132147, the projection portion extends only in a single direction. In this configuration, as the chip size is increased, the projection portion more easily extends into the lid body. Accordingly, a portion of the lid body may come into contact with the IDT electrodes and the like, resulting in breakage of the surface acoustic wave device.

SUMMARY OF THE INVENTION

Preferred embodiments of the present invention provide acoustic wave devices each including a partitioning support that does not extend into a cover.

An acoustic wave device according to a preferred embodiment of the present invention includes a piezoelectric substrate including a first side defining a portion of an outer circumference, and a second side shorter than the first side, a plurality of IDT electrodes on the piezoelectric substrate, a support including a cavity and disposed on the piezoelectric substrate so as to surround the plurality of IDT electrodes with the cavity, a first partitioning support and a second partitioning support on the piezoelectric substrate and disposed in an inner side of the cavity of the support, and a cover on the support and covering the cavity of the support. An extending direction of the first partitioning support is parallel or substantially parallel to an extending direction of the first side of the piezoelectric substrate and an extending direction of the second partitioning support is orthogonal or substantially orthogonal to the extending direction of the first partitioning support.

With the acoustic wave devices according to preferred embodiments of the present invention, the partitioning support does not extend into the cover.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Each of the preferred embodiments described in the present specification is exemplary and a configuration can be partially replaced or combined with another configuration between different preferred embodiments.

Figure 1:
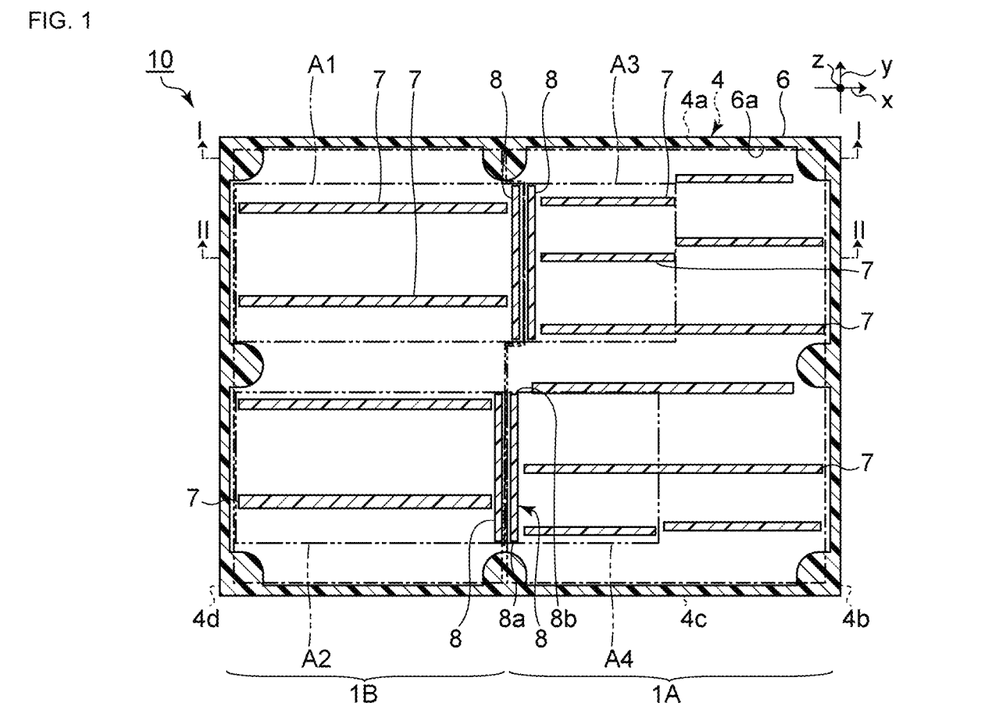
FIG. 1 is a plan view of an acoustic wave device according to a first preferred embodiment of the present invention.

FIG. 1 is a plan view of an acoustic wave device according to a first preferred embodiment of the present invention. FIG. 1 omits illustration of an electrode structure such as a resonator. The dashed-dotted line depicts a portion in which each band pass filter is provided.

An acoustic wave device 10 according to the present preferred embodiment is a duplexer including a first band pass filter 1A and a second band pass filter 1B. The first band pass filter 1A is a transmission filter of Band71. More specifically, a pass band of the first band pass filter 1A is, for example, from about 663 MHz to about 698 MHz. The second band pass filter 1B is a reception filter of Band71. More specifically, a pass band of the second band pass filter 1B is, for example, from about 617 MHz to about 652 MHz. Here, the pass bands of the first band pass filter 1A and the second band pass filter 1B are not limited to the above-described pass bands.

The acoustic wave device 10 according to the present preferred embodiment is a duplexer. However, the acoustic wave device according to the present invention may be a band pass filter such as a ladder filter and a longitudinally coupled resonator acoustic wave filter or may be a multiplexer, for example.

The acoustic wave device 10 includes an antenna terminal, a first signal terminal, and a second signal terminal. The antenna terminal is connected with an antenna. The first signal terminal and the second signal terminal are connected with respective signal potentials. The first band pass filter 1A is connected between the antenna terminal and the first signal terminal. The second band pass filter 1B is connected between the antenna terminal and the second signal terminal. Each of the first band pass filter 1A and the second band pass filter 1B includes a plurality of resonators. In the present specification, the resonator includes an acoustic wave resonator and a longitudinally coupled resonator acoustic wave filter. The circuit configurations of the first band pass filter 1A and second band pass filter 1B are not limited.

Figure 2:
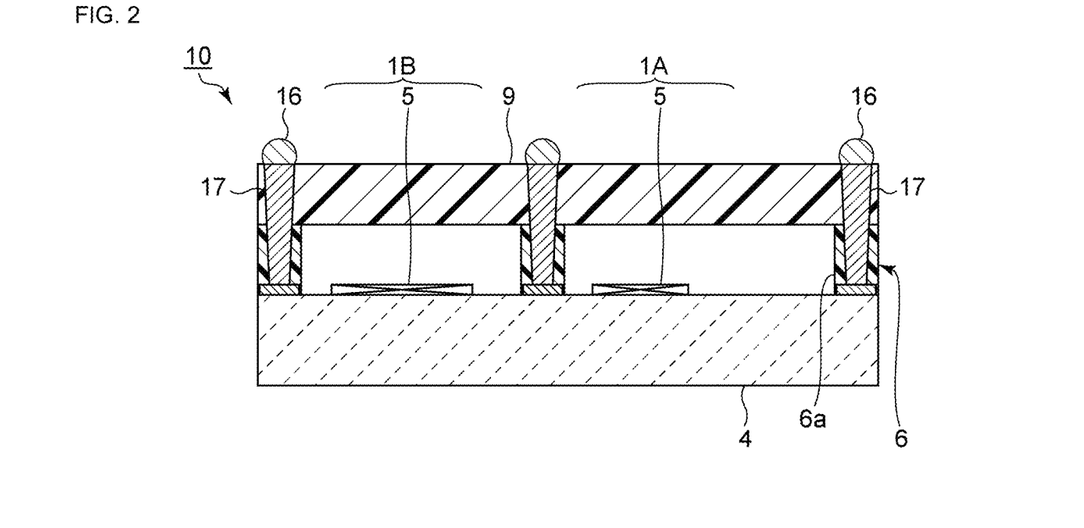
FIG. 2 is a sectional view taken along a I-I line of FIG. 1.

FIG. 2 is a sectional view taken along a I-I line of FIG. 1. In FIG. 2, an IDT electrode is illustrated with a sketch of a rectangle with two diagonal lines. The same is applied to other sectional views.

The acoustic wave device 10 includes a piezoelectric substrate 4. As illustrated in FIG. 1, the piezoelectric substrate 4 has a rectangular or substantially rectangular plate shape. The piezoelectric substrate 4 includes a first side 4a, a second side 4b, a third side 4c, and a fourth side 4d. Each of the first side 4a, the second side 4b, the third side 4c, and the fourth side 4d is a portion of an outer circumference of the piezoelectric substrate 4. In the present specification, the outer circumference means an outer circumference in plan view. The plan view means a direction viewed from the upper side in FIG. 2.

The extending direction of the first side 4a is orthogonal or substantially orthogonal to the extending direction of the second side 4b. Here, the extending direction of the first side 4a is defined as an x direction and the direction orthogonal or substantially orthogonal to the x direction is defined as a y direction. The direction orthogonal or substantially orthogonal to the x direction and the y direction is defined as a z direction. The first side 4a and the third side 4c are opposed to each other and the second side 4b and the fourth side 4d are opposed to each other. The first side 4a and the third side 4c are long sides, and the second side 4b and the fourth side 4d are short sides shorter than the long sides. Here, the shape of the piezoelectric substrate 4 is not limited to the above-described shape. In the present specification, being orthogonal or substantially orthogonal includes intersecting at about 90°±20° as well as intersecting at about 90°.

The piezoelectric substrate 4 is a piezoelectric layer. Examples of the material of the piezoelectric layer include lithium tantalate, lithium niobate, zinc oxide, aluminum nitride, crystal, and PZT. However, the piezoelectric substrate 4 may be a multilayer substrate including a plurality of layers including a piezoelectric layer.

As illustrated in FIG. 2, a plurality of IDT electrodes 5 are provided on the piezoelectric substrate 4. The resonators of the first band pass filter 1A and the second band pass filter 1B include respective IDT electrodes. Design parameters of respective resonators can be varied depending on desired characteristics.

The above-described antenna terminal, first signal terminal, and second signal terminal are provided on the piezoelectric substrate 4. A plurality of ground terminals, which are connected to a ground potential, are also provided on the piezoelectric substrate 4.

A support 6 is provided on the piezoelectric substrate 4 and surrounds the plurality of IDT electrodes 5. The support 6 includes a cavity 6a. The support 6 surrounds the plurality of IDT electrodes 5 with the cavity 6a. The support 6 covers the antenna terminal, the first signal terminal, the second signal terminal, and the plurality of ground terminals.

A plurality of first partitioning supports 7 and a plurality of second partitioning supports 8 are provided on the piezoelectric substrate 4. More specifically, the first partitioning supports 7 and the second partitioning supports 8 are positioned on the inner sides of the cavity 6a of the support 6. The first partitioning supports 7 and the second partitioning supports 8 are provided between the IDT electrodes 5. The extending direction of the first partitioning support 7 is parallel or substantially parallel to the x direction in which the first side 4a extends. The extending direction of the second partitioning support 8 is orthogonal or substantially orthogonal to the extending direction of the first partitioning support 7. Thus, the extending direction of the second partitioning support 8 is parallel or substantially parallel to the y direction. The second partitioning support 8 includes a first end portion 8a and a second end portion 8b that are opposed to each other.

Here, dimensions along directions that are orthogonal or substantially orthogonal to respective extending directions of the first partitioning support 7 and the second partitioning support are defined as respective widths of the first partitioning support 7 and the second partitioning support 8. In the present preferred embodiment, the width of the first partitioning support 7 and the width of the second partitioning support 8 are different from each other. More specifically, the width of the second partitioning support 8 is smaller than or equal to the width of the first partitioning supports 7. Here, the first partitioning supports 7 may have different widths from each other, and the second partitioning supports 8 may have different widths from each other. Alternatively, the first partitioning support 7 and the second partitioning support 8 may have the same widths as each other.

The width of the first partitioning support 7 and the width of the second partitioning support 8 are, for example, about 60 μm or less. However, the width of the second partitioning support 8 is not limited to this width.

In the present preferred embodiment, wiring connected with the signal potential is not in contact with the second partitioning supports 8. More specifically, the distance between each wiring and the second partitioning support 8 is greater than or equal to the width of the second partitioning support 8. The distance between the second partitioning support 8 and each IDT electrode 5 is also greater than or equal to the width of the second partitioning support 8.

In a region A1, a region A2, a region A3, and a region A4 illustrated in FIG. 1, a portion between the first end portion 8a and the second end portion 8b of the second partitioning support is positioned on extension lines following the extending directions of the plurality of first partitioning supports 7. In each of the regions, the distance between the first partitioning support 7 and the second partitioning support 8 is smaller than or equal to the width of the second partitioning supports 8. However, the distance between the first partitioning support 7 and the second partitioning support 8 is not limited to the above-described distance. For example, the distance between the first partitioning support 7 and the second partitioning support 8 may be smaller than or equal to the largest width among the widths of the plurality of first partitioning supports 7.

Here, the first end portions 8*a* or the second end portions 8*b* of the second partitioning supports 8 may be positioned on the extension lines following the extending directions of the plurality of first partitioning supports 7.

The plurality of second partitioning supports 8 are arranged in an orthogonal or substantially orthogonal direction to the extending direction of the second partitioning supports 8 at intervals which are smaller than or equal to the widths of the plurality of second partitioning supports 8. More specifically, the second partitioning supports 8 are aligned two by two, in the present preferred embodiment.

The plurality of first partitioning supports 7 and the plurality of second partitioning supports 8 are not in contact with the support 6. The first partitioning supports 7 are not in contact with each other and the second partitioning supports 8 are not in contact with each other. The plurality of first partitioning supports 7 and the plurality of second partitioning supports 8 are not in contact with each other. However, the first partitioning support 7 or the second partitioning support 8 may be in contact with the support 6, for example. The arrangement of the plurality of first partitioning supports 7 and second partitioning supports 8 illustrated in FIG. 1 is an example and is not limited to the above-described arrangement.

As illustrated in FIG. 2, a cover 9 is provided on the support 6 so as to cover the cavity 6*a*. A plurality of under bump metal layers 17 penetrate through the cover 9 and the support 6. One end of each of the under bump metal layers 17 is connected with corresponding terminal such as the antenna terminal and the ground terminal. A bump 16 is bonded to the other end of the under bump metal layer 17.

The plurality of IDT electrodes 5 are provided in a hollow space surrounded by the piezoelectric substrate 4, the support 6, and the cover 9. Thus, the acoustic wave device 10 according to the present preferred embodiment has the WLP structure.

Here, the first band pass filter 1A according to the present preferred embodiment is a ladder filter that includes a plurality of series arm resonators and a plurality of parallel arm resonators. The second band pass filter 1B includes a longitudinally coupled resonator acoustic wave filter, a series arm resonator, and a parallel arm resonator. Here, the series arm resonators and the parallel arm resonators of the first band pass filter 1A and the second band pass filter 1B are, for example, acoustic wave resonators. The circuit configuration of the acoustic wave device 10 is not limited to the above-described configuration. Specific configurations of the plurality of series arm resonators, the plurality of parallel arm resonators, and the longitudinally coupled resonator acoustic wave filter will be described below.

Figure 3:
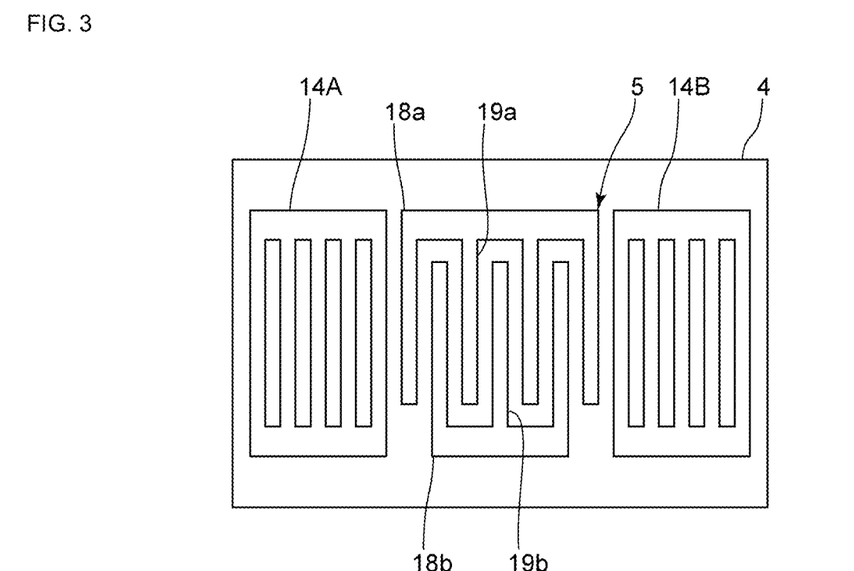
FIG. 3 is a plan view illustrating an electrode structure of a series arm resonator according to the first preferred embodiment of the present invention.

FIG. 3 is a plan view illustrating an electrode structure of the series arm resonator according to the first preferred embodiment. FIG. 3 omits illustration of wiring and the like connected to the series arm resonator.

The series arm resonator includes the IDT electrode 5. The IDT electrode 5 is provided on the piezoelectric substrate 4. When an AC voltage is applied to the IDT electrode 5, an acoustic wave is excited. A pair of reflectors 14A and 14B are provided on respective sides in the acoustic wave propagation direction on the piezoelectric substrate 4. The IDT electrode 5, the reflector 14A, and the reflector 14B may include a multilayer metal film, which is obtained by laminating a plurality of metal layers, or may be a single layer metal film. A plurality of series arm resonators and a plurality of parallel arm resonators in the acoustic wave device 10 other than the series arm resonator illustrated in FIG. 3 are configured in the same or similar manner. Design parameters of respective series arm resonators and parallel arm resonators can be varied depending on desired characteristics, as described above. In the present preferred embodiment, the plurality of series arm resonators and the plurality of parallel arm resonators are, for example, surface acoustic wave (SAW) devices.

Figure 4:
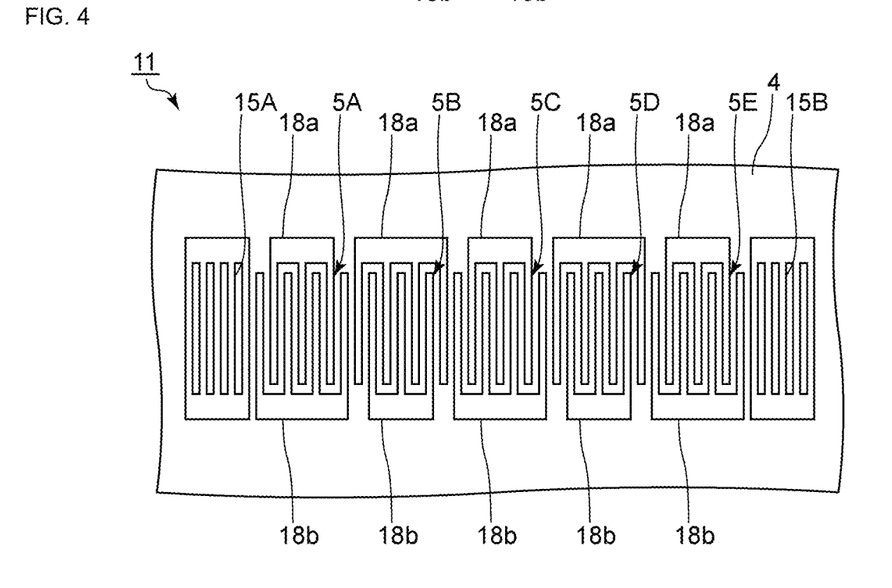
FIG. 4 is a plan view illustrating an electrode structure of a longitudinally coupled resonator acoustic wave filter according to the first preferred embodiment of the present invention.

FIG. 4 is a plan view illustrating an electrode structure of the longitudinally coupled resonator acoustic wave filter according to the first preferred embodiment. FIG. 4 omits illustration of wiring and the like connected to the series arm resonator.

A longitudinally coupled resonator acoustic wave filter includes an IDT electrode 5A, an IDT electrode 5B, an IDT electrode 5C, an IDT electrode 5D, and an IDT electrode 5E. The IDT electrode 5A, the IDT electrode 5B, the IDT electrode 5C, the IDT electrode 5D, and the IDT electrode 5E are provided on the piezoelectric substrate 4. A pair of reflectors 15A and 15B are provided on respective sides in the acoustic wave propagation direction of the plurality of IDT electrodes on the piezoelectric substrate 4. More specifically, the plurality of IDT electrodes are provided between the pair of reflectors 15A and 15B in the acoustic wave propagation direction. In the present preferred embodiment, the longitudinally coupled resonator acoustic wave filter 11 is, for example, a 5-IDT longitudinally coupled resonator acoustic wave filter. However, not limited to this, the longitudinally coupled resonator acoustic wave filter 11 may be 3-IDT longitudinally coupled resonator acoustic wave filter, a 7-IDT longitudinally coupled resonator acoustic wave filter, or the like, for example.

The present preferred embodiment has the following configuration. 1) Both of the first partitioning supports 7 and the second partitioning supports 8 are provided. 2) The extending direction of the first partitioning support 7 is parallel or substantially parallel to the extending direction of the first side 4*a* of the piezoelectric substrate 4, and the extending direction of the second partitioning support 8 is orthogonal or substantially orthogonal to the extending direction of the first partitioning support 7. Accordingly, the first partitioning support 7 and the second partitioning support 8 do not extend into the cover 9. This will be described below with a non-limiting example of a method for manufacturing the acoustic wave device 10 according to the present preferred embodiment.

Figure 5:
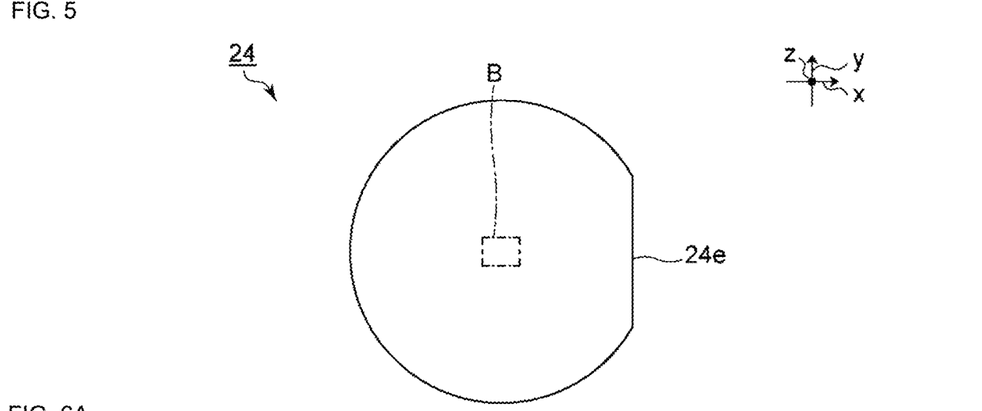
FIG. 5 is a schematic plan view of a piezoelectric substrate having a wafer shape and used in manufacturing the acoustic wave device according to the first preferred embodiment of the present invention.
Figure 6A:
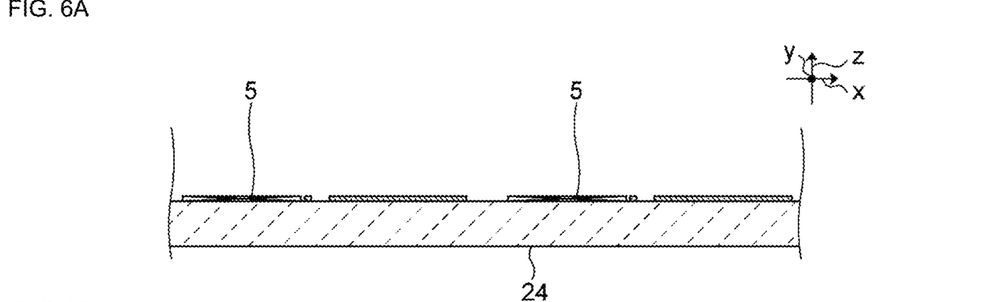
FIGS. 6A to 6C are sectional views illustrating a portion corresponding to a section taken along a II-II line of FIG. 1, for explaining a non-limiting example of a method for manufacturing the acoustic wave device according to the first preferred embodiment of the present invention.
Figure 6B:
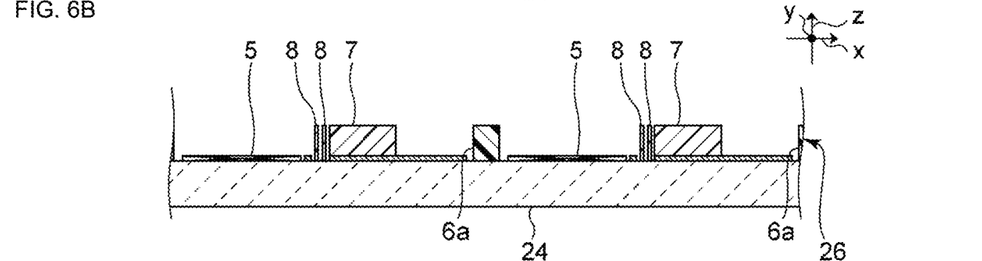
Figure 6C:
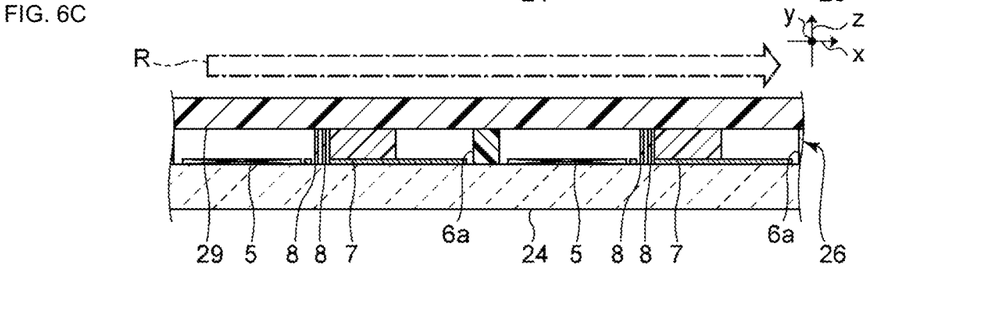

FIG. 5 is a schematic plan view of a piezoelectric substrate with a wafer shape and used in manufacturing the acoustic wave device according to the first preferred embodiment. FIGS. 6A to 6C are sectional views illustrating a portion corresponding to a section taken along a II-II line of FIG. 1, for explaining a non-limiting example of a method for manufacturing the acoustic wave device according to the first preferred embodiment.

A piezoelectric substrate 24 with a wafer shape is prepared as illustrated in FIG. 5. The piezoelectric substrate 24 has an orientation flat edge 24*e*. A dashed-dotted line B in FIG. 5 schematically shows a portion of a support which is formed in a later-described process. Based on the direction of this support used as a reference, the x direction, the y direction, and the z direction are shown. The same is applied to FIG. 6A. The extending direction of the orientation flat edge 24*e* is parallel or substantially parallel to the y direction.

Subsequently, electrode structures of a plurality of acoustic wave devices 10 are formed on the piezoelectric substrate 24 as illustrated in FIG. 6A. More specifically, a plurality of IDT electrodes, a plurality of reflectors, a plurality of antenna terminals, a plurality of ground terminals, a plurality of first signal terminals, a plurality of second signal terminals, respective wiring, and the like are formed on the piezoelectric substrate 24. In manufacturing the acoustic wave device 10 according to the present preferred embodiment, each IDT electrode is formed so that the extending direction of an electrode finger of each IDT electrode is parallel or substantially parallel to the y direction in which the orientation flat edge 24e extends. The electrode structures can be formed by sputtering, vapor deposition, and the like, for example.

Then, a support 26, a plurality of first partitioning supports 7, and a plurality of second partitioning supports 8 are formed on the piezoelectric substrate 24 as illustrated in FIG. 6B. The support 26 includes a plurality of cavities 6a. The support 26 is formed so that the cavities 6a surround respective electrode structures of the acoustic wave devices 10. In manufacturing the acoustic wave device 10 according to the present preferred embodiment, the support 26 is formed so that the extending direction of the orientation flat edge 24e of the piezoelectric substrate 24 is parallel or substantially parallel to the y direction as described above. The support 26, the plurality of first partitioning supports 7, and the plurality of second partitioning supports 8 can be formed by photolithography, for example.

After that, a cover 29 is formed on the support 26, the plurality of first partitioning supports 7, and the plurality of second partitioning supports 8 so as to cover the plurality of cavities 6a of the support 26, as illustrated in FIG. 6C. In this process, the cover 29 which is heated is pressed on the support 26, the plurality of first partitioning supports 7, and the plurality of second partitioning supports 8 with a roller. More specifically, the cover 29 is pressed on the support 26 and the like while moving the roller in the x direction, which is orthogonal or substantially orthogonal to the y direction in which the orientation flat 24e extends, as illustrated with an arrow R in FIG. 6C, in the present preferred embodiment.

Figure 7A:
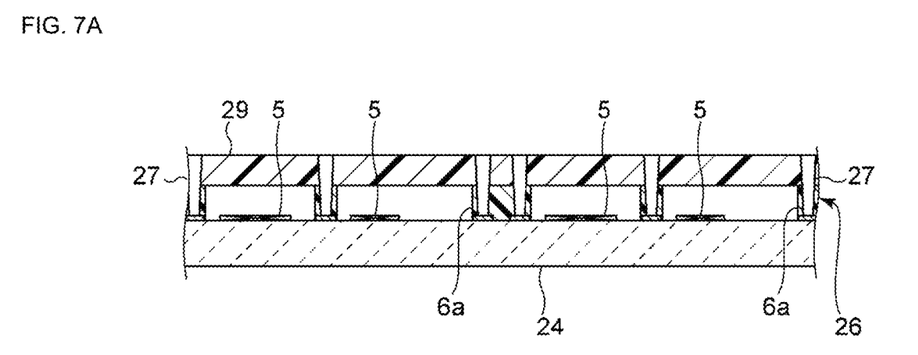
FIGS. 7A to 7C are sectional views illustrating a portion corresponding to a section taken along the I-I line of FIG. 1, for explaining a non-limiting example of a method for manufacturing the acoustic wave device according to the first preferred embodiment of the present invention.
Figure 7B:
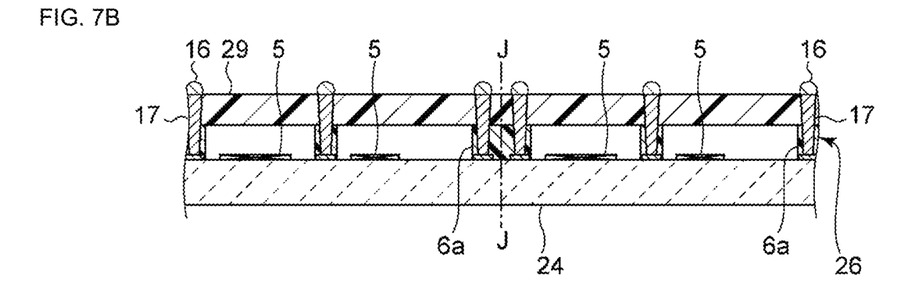
Figure 7C:
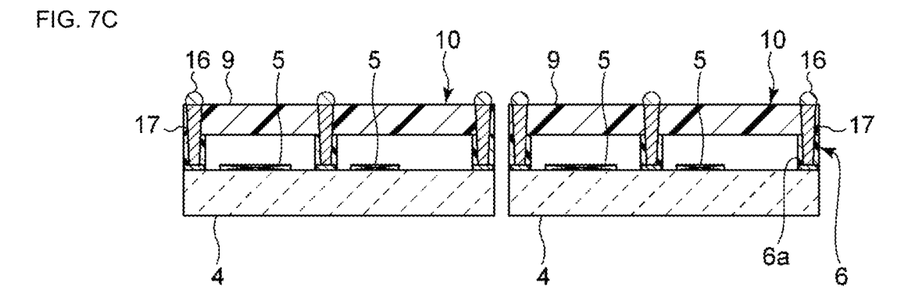

FIGS. 7A to 7C are sectional views illustrating a portion corresponding to a section taken along the I-I line of FIG. 1, for explaining a non-limiting example of a method for manufacturing the acoustic wave device according to the first preferred embodiment.

Next, a plurality of through holes 27 that penetrate through the cover 29 and the support 26 are formed as illustrated in FIG. 7A. The through holes 27 are formed so as to extend to corresponding terminals such as the ground terminal and the antenna terminal. The through holes 27 can be formed by laser light irradiation, for example. Alternatively, the through holes 27 may be formed by sandblasting or the like longitudinally coupled resonator acoustic wave filter.

After that, the under bump metal layer 17 is formed in the through hole 27 as illustrated in FIG. 7B. The under bump metal layer 17 can be formed by plating, for example. Subsequently, the bump 16 is provided so as to be bonded to the under bump metal layer 17. Then, the cover 29, the support 26, and the piezoelectric substrate 24 are divided into pieces along a J-J line in FIG. 7B by dicing or the like. A plurality of acoustic wave devices 10 are thus obtained as illustrated in FIG. 7C.

In the process for providing the cover 29 illustrated in FIG. 6C, if the cover 29 is largely deflected in the roller moving direction, the roller tends to be positioned closer to the piezoelectric substrate 24 due to the deflection. Accordingly, the roller easily runs on the first partitioning support 7 from the position closer to the piezoelectric substrate 24. The cover 29 is strongly pressed on the first partitioning support 7 during the running on, making it easier for the first partitioning support 7 to extend into the cover 29. Especially, the roller easily runs on a portion corresponding to the first partitioning support 7 that is positioned on the inner side in plan view, within the cavity 6a of the support 26.

On the other hand, the acoustic wave device 10 according to the present preferred embodiment includes the second partitioning supports 8 in addition to the first partitioning supports 7. This can reduce deflection of the cover 29 in the z direction, in the process for providing the cover 29. Accordingly, the roller does not easily run on the first partitioning support 7 and the first partitioning support 7 does not easily extend into the cover 29. As a result, the first partitioning support 7 does not extend into the cover 9 in the acoustic wave device 10 obtained through the division into pieces.

In addition to this, the second partitioning support 8 extends in the y direction, being able to reduce the deflection in a wide range. This can increase flexibility in providing the first partitioning supports 7 and respective resonators and more securely reduce or prevent the first partitioning supports 7 from extending into the cover 29.

Here, the first partitioning supports 7 and the second partitioning supports 8 that are orthogonal or substantially orthogonal to each other are provided as in the present preferred embodiment, making it difficult for the second partitioning supports 8 to extend into the cover 29 when the roller is moved in the y direction.

A portion between the first end portion 8a and the second end portion 8b of the second partitioning support 8 is preferably positioned on extension lines following the extending directions of the plurality of first partitioning supports 7 as, for example, in the region A1 illustrated in FIG. 1. This can more effectively reduce deflection of the cover 29 around the first partitioning supports 7. Accordingly, the first partitioning supports 7 extending into the cover 29 can be even more effectively reduced or prevented.

At the same time, deflection around the second partitioning supports 8 can be more effectively reduced or prevented in a wide range in the y direction. This can effectively reduce or prevent the second partitioning supports 8 from extending into the cover 29.

In the configuration in the region A1 and the like illustrated in FIG. 1, the distance between the first partitioning support 7 and the second partitioning support 8 is preferably, for example, less than or equal to about 0.75 times as large as the largest width among the widths of the plurality of first partitioning supports 7 and the second partitioning support 8. It is more preferable that the distance is smaller than or equal to the largest width among those of the plurality of first partitioning supports 7 and the second partitioning support 8, and it is even more preferable that the distance is smaller than or equal to the smallest width among those of the plurality of first partitioning supports 7 and the second partitioning support 8. These configurations can further reduce or prevent the running of the roller on the first partitioning supports 7 or the second partitioning supports 8. This makes much more difficult for the first partitioning supports 7 or the second partitioning supports 8 to extend into the cover 29.

The width of the first partitioning support 7 is preferably about 60 μm or less, for example. This can more securely flatten a surface, on the cover 9 side, of the first partitioning support 7. Accordingly, a void is not easily produced between the first partitioning support 7 and the cover 9. In a similar manner, the width of the second partitioning support 8 is preferably about 60 µm or less, for example. Accordingly, a void is not easily produced between the second partitioning support 8 and the cover 9.

The plurality of second partitioning supports 8 are preferably aligned in the direction orthogonal or substantially orthogonal to the extending direction of the second partitioning support 8. This can effectively reduce or prevent the second partitioning supports 8 extending into the cover 9.

In this configuration, for example, it is preferable that each width of the second partitioning supports 8 aligned with each other is about 60 µm or less and the sum of the widths of the plurality of second partitioning supports 8 is about 60 µm or greater. Alternatively, for example, it is preferable that each width of the second partitioning supports 8 aligned with each other is about 60 µm or less and the sum of a distance between the plurality of second partitioning supports 8 and the widths of the plurality of second partitioning supports 8 is about 60 µm or greater. Accordingly, a void is not easily produced between the second partitioning supports 8 and the cover 9 and the second partitioning supports 8 extending into the cover 9 can be effectively reduced or prevented.

The distance between the plurality of second partitioning supports 8 aligned with each other as described above is preferably, for example, less than or equal to about 2.0 times as large as the largest width among the widths of the plurality of second partitioning supports 8. It is more preferable that, for example, the distance is smaller than or equal to the largest width among those of the plurality of second partitioning supports 8. These configurations can more securely and effectively reduce or prevent the second partitioning supports 8 from extending into the cover 9.

It is preferable that the first partitioning supports 7 and the second partitioning supports 8 are not in contact with each other. This configuration can more effectively flatten the entire surfaces, which are on the cover 9 side, of the first partitioning supports 7 and the second partitioning supports 8. Accordingly, a void is not easily produced between the first partitioning supports 7 and the cover 9 and between the second partitioning supports 8 and the cover 9.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a piezoelectric substrate including a first side defining a portion of an outer circumference, and a second side shorter than the first side;
    a plurality of IDT electrodes on the piezoelectric substrate;
    a support including a cavity and disposed on the piezoelectric substrate along an entirety of the outer circumference of the piezoelectric substrate and surrounding the IDT electrodes with the cavity;
    a first partitioning support and a second partitioning support on the piezoelectric substrate and disposed in an inner side of the cavity of the support;
    a cover on the support and covering the cavity of the support; and
    a plurality of under bump metal layers penetrating through the cover and the support; wherein
    the first partitioning support extends in only a first direction that is parallel or substantially parallel to an extending direction of the first side of the piezoelectric substrate and the second partitioning support extends in only a second direction that is orthogonal or substantially orthogonal to the first direction;
    the first partitioning support and the second partitioning support are not in contact with each other;
    the first partitioning support and the second partitioning support are not in contact with the support; and
    the support is between and overlapping with the cover and the piezoelectric substrate in a direction orthogonal or substantially orthogonal to the extending direction of the first partitioning support and the extending direction of the second partitioning support.

2. The acoustic wave device according to claim 1, wherein the piezoelectric substrate has a rectangular or substantially rectangular plate shape and the extending direction of the first side is orthogonal or substantially orthogonal to the second side.

3. The acoustic wave device according to claim 1, wherein
    a dimension of the first partitioning support along a direction that is orthogonal or substantially orthogonal to the first direction is a width of the first partitioning support; and
    a dimension of the second partitioning support along a direction that is orthogonal or substantially orthogonal to the second direction is a width of the second partitioning support.

4. The acoustic wave device according to claim 3, wherein the width of the first partitioning support and the width of the second partitioning support are about 60 µm or less.

5. The acoustic wave device according to claim 3, wherein
    a plurality of the second partitioning supports are provided; and
    the plurality of the second partitioning supports are aligned in the direction that is orthogonal or substantially orthogonal to the second direction.

6. The acoustic wave device according to claim 5, wherein a distance between the plurality of the second partitioning supports is smaller than or equal to the width of the plurality of the second partitioning supports.

7. The acoustic wave device according to claim 3, wherein
    a plurality of the first partitioning supports are provided;
    the second partitioning support includes a first end portion and a second end portion opposed to each other; and
    a portion between the first end portion and the second end portion of the second partitioning support is on an extension line corresponding to the plurality of the first partitioning supports.

8. The acoustic wave device according to claim 7, wherein a distance between at least one of the first partitioning supports and the second partitioning supports is smaller than or equal to the width of the second partitioning support.

9. The acoustic wave device according to claim 3, wherein the width of the first partitioning support and the width of the second partitioning support are different from each other.

10. The acoustic wave device according to claim 1, wherein
    a first number of the plurality of IDT electrodes defines a first band pass filter; and
    a second number of the plurality of IDT electrodes defines a second band pass filter.

11. The acoustic wave device according to claim 10, wherein the first band pass filter is a transmission filter.

12. The acoustic wave device according to claim 10, wherein the second band pass filter is a reception filter.

13. The acoustic wave device according to claim 10, wherein a pass band of the first band pass filter is from about 663 MHz to about 698 MHz.

14. The acoustic wave device according to claim 10, wherein a pass band of the second band pass filter is from about 617 MHz to about 652 MHz.

15. The acoustic wave device according to claim 10, wherein the first band pass filter is a ladder filter including a plurality of series arm resonators and a plurality of parallel arm resonators.

16. The acoustic wave device according to claim 10, wherein the second band pass filter includes a longitudinally coupled resonator acoustic wave filter, a series arm resonator, and a parallel arm resonator.

* * * * *